US010056311B2

United States Patent
Otsubo et al.

(10) Patent No.: US 10,056,311 B2
(45) Date of Patent: Aug. 21, 2018

(54) ELECTRONIC CIRCUIT MODULE

(71) Applicant: Murata Manufacturing Co., Ltd., Kyoto (JP)

(72) Inventors: Yoshihito Otsubo, Kyoto (JP); Muneyoshi Yamamoto, Kyoto (JP); Norio Sakai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/655,070

(22) Filed: Jul. 20, 2017

(65) Prior Publication Data
US 2017/0323838 A1 Nov. 9, 2017

Related U.S. Application Data

(63) Continuation of application No. PCT/JP2016/050719, filed on Jan. 12, 2016.

(30) Foreign Application Priority Data

Jan. 30, 2015 (JP) ................................. 2015-016269

(51) Int. Cl.
*H01L 29/40* (2006.01)
*H01L 23/52* (2006.01)
(Continued)

(52) U.S. Cl.
CPC .............. *H01L 23/14* (2013.01); *H01L 23/28* (2013.01); *H01L 23/481* (2013.01);
(Continued)

(58) Field of Classification Search
CPC ......... H01L 23/28; H01L 23/52; H01L 23/48; H01L 23/49
(Continued)

(56) References Cited

U.S. PATENT DOCUMENTS

| 5,977,845 A * | 11/1999 | Kitahara | ............... | H03H 7/0115 |
| | | | | 333/184 |
| 2013/0194756 A1* | 8/2013 | Aso | ...................... | H05K 9/0024 |
| | | | | 361/728 |
| 2017/0256474 A1* | 9/2017 | Fujinaga | ............. | H01L 23/3675 |

FOREIGN PATENT DOCUMENTS

| JP | 2009004584 A | | 1/2009 | | |
| JP | 2009218484 A | * | 9/2009 | ............. | H01L 24/97 |

(Continued)

OTHER PUBLICATIONS

English translation of FP: JP2009218484.*
(Continued)

*Primary Examiner* — Sheikh Maruf
(74) *Attorney, Agent, or Firm* — Pearne & Gordon LLP

(57) ABSTRACT

An electronic circuit module includes a circuit board, electronic components, an embedding layer, and a conductive film. The circuit board has a first principal surface, a second principal surface and a side surface, and includes a pattern conductor and a via conductor. The conductive film is connected to a conduction path to a ground electrode. The side surface includes a first region, a second region having a longer circumferential length than the first region, and a connection region connecting the first region and the second regions. The conductive film is formed on a region including at least part of each of an outer surface of the embedding layer, the first region, and the connection region. The conductive film formed on at least part of the connection region is connected to an exposed portion in the connection region of the via conductor included in the conduction path to the ground electrode.

8 Claims, 11 Drawing Sheets

(51) Int. Cl.
 *H01L 23/48* (2006.01)
 *H01L 23/14* (2006.01)
 *H05K 1/18* (2006.01)
 *H01L 23/495* (2006.01)
 *H01L 23/28* (2006.01)
 *H01L 29/41* (2006.01)
 *H01L 23/498* (2006.01)

(52) U.S. Cl.
 CPC .. *H01L 23/49572* (2013.01); *H01L 23/49827* (2013.01); *H01L 23/52* (2013.01); *H01L 29/41* (2013.01); *H05K 1/188* (2013.01)

(58) Field of Classification Search
 USPC ..................................... 257/773, 774, 751
 See application file for complete search history.

(56) References Cited

FOREIGN PATENT DOCUMENTS

| | | | |
|---|---|---|---|
| JP | 2010245139 | A | 10/2010 |
| JP | 2011003584 | A | 1/2011 |
| JP | 2013161831 | A | 8/2013 |
| JP | 2015012022 | A | 1/2015 |

OTHER PUBLICATIONS

International Search Report issued in PCT/JP2016/050719 dated Apr. 19, 2016.
Written Opinion issued in PCT/JP2016/050719 dated Apr. 19, 2016.

\* cited by examiner

ELECTRONIC CIRCUIT MODULE

This is a continuation of International Application No. PCT/JP2016/050719 filed on Jan. 12, 2016 which claims priority from Japanese Patent Application No. 2015-016269 filed on Jan. 30, 2015. The contents of these applications are incorporated herein by reference in their entireties.

BACKGROUND OF THE DISCLOSURE

Field of the Disclosure

The present disclosure relates to electronic circuit modules.

Description of the Related Art

In recent years, to meet requirements for higher performance and higher manufacturing efficiency of electronic apparatuses, electronic circuit modules in which electronic components are connected to a circuit board and embedded in an embedding layer on the surface of which a conductive film is provided have been used in many cases. An example of such an electronic circuit module has been proposed in Japanese Unexamined Patent Application Publication No. 2009-4584 (Patent Document 1).

FIGS. 12A and 12B include cross-sectional views of an electronic circuit module 700 described in Patent Document 1. FIG. 12A is a cross-sectional view of a surface including a C-C line and seen in an arrow direction in FIG. 12B. FIG. 12B is a cross-sectional view of a surface including a B-B line and seen in an arrow direction in FIG. 12A. In the electronic circuit module 700 illustrated in FIGS. 12A and 12B, electronic components 703 and 704 are respectively connected to circuit boards 701 and 702. The electronic component 703 is embedded in an electrical insulating layer 705, and the electronic components 704 are embedded in an embedding layer 706. The circuit boards 701 and 702 are electrically connected to each other with a via 707 formed in a columnar shape and a via reception land 708.

On a surface of the embedding layer 706, there is provided a conductive film 709 to serve as a shield layer. The conductive film 709 is connected to a cutting surface in an axial direction of a via 710 formed in a columnar shape, and is connected to a ground electrode (not shown) through the via 710 and the via reception land 708. It is stated that the conductive film 709 is stably grounded in the electronic circuit module 700 with the above-discussed structure.

Patent Document 1: Japanese Unexamined Patent Application Publication No. 2009-4584

BRIEF SUMMARY OF THE DISCLOSURE

In the above-discussed electronic circuit module 700, a connection surface between the conductive film 709 and the via 710 is a cutting surface for obtaining individual electronic circuit modules 700 from a collective board and is merely a flat surface. This raises a risk that a connection area between the conductive film 709 and a cross section of the via 710 becomes small. Accordingly, there is a risk that the connection between the conductive film 709 and the ground electrode is not satisfactorily established.

As such, an object of the present disclosure is to provide an electronic circuit module in which a conductive film to serve as a shield layer is connected to a ground electrode with certainty.

In the present disclosure, an electronic circuit module includes a conductive film to serve as a shield layer, and a via conductor included in a conduction path that extends to a ground electrode; in order to electrically connect the conductive film to the via conductor with certainty, it is intended to improve a structure of the connection between the conductive film and the via conductor.

An electronic circuit module according to the present disclosure includes a circuit board, an electronic component, an embedding layer, and a conductive film. The circuit board has a first principal surface on which a first electrode is provided, a second principal surface on which a second electrode including a ground electrode is provided, and a side surface connecting the first principal surface and the second principal surface, and includes, as an inner conductor, a pattern conductor and a via conductor. The electronic component is connected to the first electrode. The embedding layer is provided on the first principal surface of the circuit board while embedding the electronic component. The conductive film is connected to a conduction path that extends to the ground electrode.

The side surface of the circuit board includes a first region connected to the first principal surface, a second region connected to the second principal surface and having a longer circumferential length than that of the first region, and a connection region connected to the first region and the second region. The conduction path that extends to the ground electrode includes the via conductor. The conductive film is formed on a region including at least part of each of an outer surface of the embedding layer, the first region, and the connection region. The conductive film formed on at least part of the connection region is connected to an exposed portion in the connection region of the via conductor included in the conduction path that extends to the ground electrode.

In the electronic circuit module described above, the circumferential length of the second region is longer than that of the first region so that the connection region between the first region and the second region is formed in a shape spreading from the first region toward the second region when the electronic circuit module being viewed from above. Here, the circumferential length of the first region refers to a length of a portion connecting the first region and the first principal surface. The circumferential length of the second region refers to a length of a portion connecting the second region and the second principal surface. Furthermore, the expression "when the electronic circuit module being viewed from above" is equivalent to an expression "when the electronic circuit module being viewed from the first principal surface side of the circuit board 1".

That is, because the exposed portion in the connection region of the via conductor has a three-dimensional shape different from the flat exposed portion described in the aforementioned Background Art, a contact area with the conductive film is large in comparison with the flat exposed portion. This makes it possible to connect the conductive film to the ground electrode with certainty and obtain a large shield effect. Note that in the present disclosure, a cross section in an axis direction of the via conductor is not limited to a circular shape, and may take other shapes.

It is preferable that the electronic circuit module according to the present disclosure have a feature as follows. That is, the conduction path extending to the ground electrode includes a plurality of via conductors. The plurality of via conductors are formed so that neighboring via conductors overlap with each other when the electronic circuit module being viewed from above. Then, the conductive film formed on at least part of the connection region is connected to the exposed portions in the connection region of at least a pair of neighboring via conductors.

In the above electronic circuit module, the conduction path extending to the ground electrode includes the plurality of via conductors, and the plurality of via conductors are formed so that neighboring via conductors overlap with each other in a top view. That is, the conduction path extending from the conductive film to the ground electrode is routed with the via conductors substantially having lower electric resistance than the pattern conductor. Further, the conduction path is configured so that a distance from the conductive film to the ground electrode becomes short. As such, because electric resistance of the conduction path is suppressed to be low, a large shield effect can be obtained.

It is more preferable that the above preferred embodiment of the electronic circuit module according to the present disclosure have a feature as follows. That is, the plurality of via conductors are formed while center axes thereof being shifted from each other along the connection region when the electronic circuit module being viewed from above.

In the above electronic circuit module, because the plurality of via conductors associated with the conduction path extending to the ground electrode are formed along the connection region, an area of the exposed portions in the connection region of the via conductors is larger than that in the case where the center axes of the via conductors are the same. Accordingly, it is possible to more surely connect the conductive film to the ground electrode and obtain a larger shield effect.

It is more preferable that the above preferred embodiment of the electronic circuit module according to the present disclosure have the following additional feature. Further, it is also more preferable that the more preferred embodiment having the above-mentioned feature have the following additional feature. That is, at least a pair of the neighboring via conductors is formed sandwiching the pattern conductor. Then, the conductive film formed on at least part of the connection region is connected to the exposed portions in the connection region of at least the pair of neighboring via conductors and the pattern conductor sandwiched between the neighboring via conductors.

In the above electronic circuit module, at least a pair of neighboring via conductors that is connected to the conductive film and is associated with the conduction path extending to the ground electrode is formed sandwiching the pattern conductor. In other words, the pattern conductor sandwiched between the via conductors is also connected to the conduction path extending to the ground electrode with certainty. As such, because noise coming from the exterior and noise generated from the electronic component both flow into the ground electrode with certainty, excellent electrical characteristics can be obtained.

Further, in the above circuit module, the pattern conductor and the conductive film are connected to each other with certainty. As such, noise generated from the electronic component scatters and flows into a plurality of ground electrodes through the conductive film, which also contributes to the excellent electrical characteristics.

It is more preferable that the above preferred embodiment of the electronic circuit module according to the present disclosure have the following further additional feature. Moreover, it is also more preferable that the more preferred embodiment having the above-mentioned feature or the additional feature have the following further additional feature. That is, the conductive film is formed on a region including at least part of each of the outer surface of the embedding layer, the first region, the connection region, and the second region. Then, the conductive film formed on at least part of each of the connection region and the second region is connected to the exposed portions of the plurality of via conductors in each of the connection region and the second region.

In the above electronic circuit module, the conductive film is formed on at least part of each of the connection region and the second region. Further, the conductive film is connected to the exposed portions of the plurality of via conductors in each of the connection region and the second region. Accordingly, since the conductive film is more surely connected to the ground electrode and the conductive film is so formed as to reach the second region, a higher shield effect can be obtained. In addition, since a solder fillet is also formed in the second region when the electronic circuit module is mounted on a circuit board of an electronic apparatus by soldering, the enhancement of bonding strength can be expected.

In the electronic circuit module according to the present disclosure, the circumferential length of the second region is longer than that of the first region so that the connection region between the first region and the second region is formed in a shape spreading from the first region toward the second region when the electronic circuit module being viewed from above. In other words, because the exposed portion in the connection region of the via conductor has a three-dimensional shape different from the flat exposed portion described in the aforementioned Background Art, a contact area with the conductive film is large in comparison with the flat exposed portion. This makes it possible to connect the conductive film to the ground electrode with certainty and obtain a large shield effect.

BRIEF DESCRIPTION OF THE SEVERAL VIEWS OF THE DRAWINGS

FIG. 3 corresponds to FIG. 2.

FIG. 4 corresponds to FIG. 2.

FIG. 7 corresponds to FIG. 2.

FIGS. 8A and 8B correspond to FIG. 2.

FIG. 9 corresponds to FIG. 2.

DETAILED DESCRIPTION OF THE DISCLOSURE

Hereinafter, the features of the present disclosure will be described in more detail through the descriptions of the embodiments of the present disclosure.

First Embodiment of Electronic Circuit Module

Figure 1A:
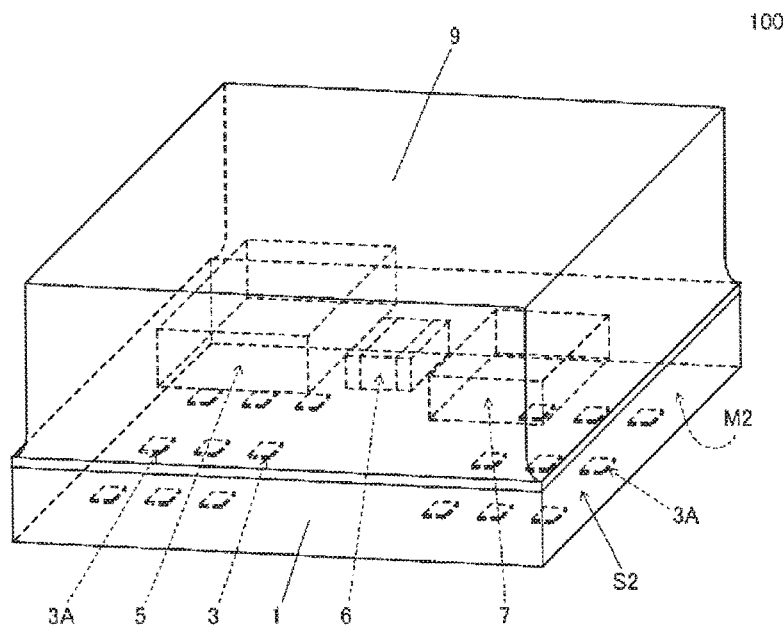
FIGS. 1A and 1B include a perspective view and a top view of an electronic circuit module 100 according to a first embodiment of the present disclosure in which a general configuration inside the electronic circuit module 100 is illustrated in a see-through manner.
Figure 1B:
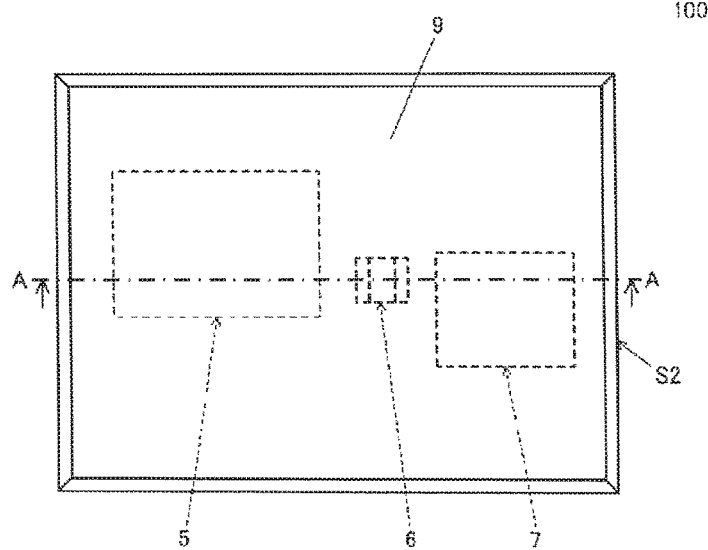
Figure 2:
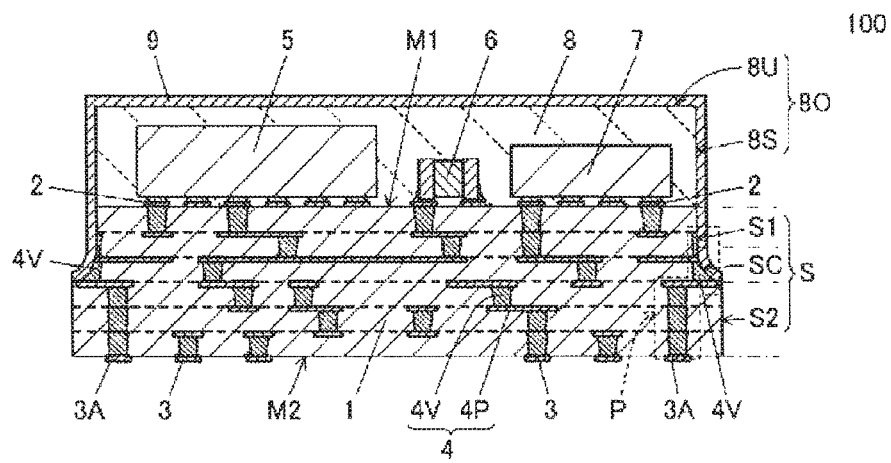
FIG. 2 is a cross-sectional view of a surface of the electronic circuit module 100 according to the first embodiment of the present disclosure; the stated surface includes an A-A line and is seen in an arrow direction in FIG. 1B.

An electronic circuit module 100 according to a first embodiment of the present disclosure will be described with reference to FIG. 1A, FIG. 1B and FIG. 2.
<Structure of Electronic Circuit Module>
FIG. 1A is a see-through perspective view of the electronic circuit module 100. In FIG. 1A, electronic components 5 to 7 and a second electrode 3 including a ground electrode 3A, which will be explained later, are illustrated in a see-through manner, and other constituent elements are omitted in the drawing. FIG. 1B is a top view in which the electronic components 5 to 7 are illustrated likewise in the see-through manner, and other constituent elements are omitted in the drawing. FIG. 2 is a cross-sectional view of a surface of the electronic circuit module 100; the stated surface includes an A-A line and is seen in an arrow direction in FIG. 1B.

The electronic circuit module 100 includes a circuit board 1, the electronic components 5 to 7, an embedding layer 8, and a conductive film 9.

The circuit board 1 is a multilayer board which uses an insulative resin material enhanced by glass fiber, a ceramic material, or the like as a base material, and on the surfaces and at the inside of which a circuit pattern made of a conductor is formed. In FIG. 2, although broken lines are drawn inside the circuit board 1, these broken lines are used to indicate that the circuit board 1 is formed of the above-discussed multilayer board, and therefore do not mean that boundary surfaces indicated by the broken lines are actually present.

The circuit board 1 has a first principal surface M1 on which a first electrode 2 is provided, a second principal surface M2 on which the second electrode 3 including the ground electrode 3A is provided, and a side surface S connecting the first principal surface M1 and the second principal surface M2, and includes, as an inner conductor 4, a pattern conductor 4P and a via conductor 4V.

The pattern conductor 4P is a conductor that is formed on the principal surfaces and at the inside of the circuit board 1 so as to be substantially parallel to the principal surfaces. The via conductor 4V is a conductor that is formed inside the circuit board 1 so as to be substantially orthogonal to the principal surfaces. The circuit pattern of the circuit board 1 is formed by combining the pattern conductor 4P and the via conductor 4V.

For example, in FIG. 2, the ground electrode 3A is distanced from the side surface S of the circuit board 1. Because of this, a conduction path P extending to the ground electrode 3A is configured including two pairs of rows of the via conductors 4V and the pattern conductor 4P; the two pairs of rows of the via conductors 4V are respectively connected to a portion near one end and a portion near the other end of the pattern conductor 4P. These two pairs of rows of the via conductors 4V are formed at the positions which do not overlap with each other when the electronic circuit module 100 being viewed from above. As such, the conduction path P has a bending shape.

Then, at least one of the via conductors 4V configuring the conduction path P that extends to the ground electrode 3A is exposed to at least part of a connection region SC, which will be explained later, on the side surface S of the circuit board 1. The conduction path P is connected to the conductive film 9 at an exposed portion of the via conductor 4V as described later.

As shown in FIG. 2, halfway in a row of the via conductors 4V, the pattern conductor 4P may be sandwiched between at least a pair of neighboring via conductors 4V that are so formed as to overlap with each other in a top view.

The side surface S of the circuit board 1 includes a first region S1 connected to the first principal surface M1, a second region S2 connected to the second principal surface M2 and having a longer circumferential length than that of the first region, and the connection region SC connected to the first region S1 and the second region S2. As described earlier, the circumferential length of the first region S1 and the circumferential length of the second region S2 refer to the length of a portion connecting the first region S1 and the first principal surface M1 and the length of a portion connecting the second region S2 and the second principal surface M2, respectively.

On the side surface S of the circuit board 1, as discussed above, the circumferential length of the second region S2 is longer than that of the first region S1. Here, the connection region SC between the first region S1 and the second region S2 is formed in a curved shape spreading from the first region S1 toward the second region S2 when the electronic circuit module 100 being viewed from above. As such, in the cross-sectional view of FIG. 2, a portion from the first region S1 through the connection region SC is illustrated in what is called a bell-bottom shape.

In FIG. 1B, the side surface S of the circuit board 1 is mirror-symmetric taking the A-A line and a line that is orthogonal to the A-A line and passes through the center of the electronic circuit module 100 as symmetry planes when the electronic circuit module 100 being viewed from above. However, it is not absolutely necessary for the side surface S of the circuit board 1 to have the above-described symmetric relationship; that is, it is sufficient for the side surface S to have a shape in which the connection region SC spreads from the first region S1 toward the second region S2 in at least one of four faces forming the side surface S of the circuit board 1, for example.

Although not limited to any specific components, the electronic components 5 to 7 are active components including semiconductor devices such as integrated circuits, transistors, and so on, and passive components including inductors, capacitors, resistors, and so on, for example. The electronic components 5 to 7 are connected to the first electrodes 2 of the circuit board 1 with a bonding material such as solder or the like, for example.

The embedding layer 8 is formed of an insulative resin material or an insulative resin material in which, for example, a glass material, silica, or the like, is dispersed as a filler. The embedding layer 8 may be formed of a single insulative resin material not including a filler. The embedding layer 8 is provided on the first principal surface M1 of the circuit board 1 while embedding the electronic components 5 to 7. Further, in the electronic circuit module 100 illustrated in FIG. 1A, FIG. 1B and FIG. 2, a side surface 8S of the embedding layer 8 is flush with the first region S1 within a range including a variation in manufacturing. However, it is not absolutely necessary for the side surface 8S to be flush with the first region S1; for example, the embedding layer 8 may be formed so that the side surface 8S has a shorter circumferential length than the first region S1.

The conductive film 9 is formed of a metallic thin film, a conductive resin film in which a metallic filler is dispersed in a resin base material, or the like. The conductive film 9 is formed on a region including at least part of each of an outer surface 8O encompassing the side surface 8S and an upper surface 8U of the embedding layer 8, the first region S1, and the connection region SC. The conductive film 9 formed on at least part of the connection region SC is connected to the exposed portion in the connection region SC of the via conductor 4V included in the conduction path P that extends to the ground electrode 3A. In the case where the via conductor 4V included in the conduction path P also has an exposed portion in the first region S1, the conductive film 9 is connected to the stated exposed portion as well.

In the electronic circuit module 100, the exposed portion of the via conductor 4V in the connection region SC of the side surface S of the circuit board 1 is formed in a shape similar to the bell-bottom shape of the connection region SC, unlike the flat exposed portion described in the aforementioned Background Art. In other words, since the exposed portion in the connection region SC of the via conductor 4V has a three-dimensional shape, a contact area thereof with the conductive film becomes larger than that of the flat exposed portion, thereby establishing the connection between the conductive film 9 and the ground electrode 3A with certainty.

As discussed above, there is a case in which, halfway in a row of the via conductors 4V, the pattern conductor 4P is sandwiched between at least a pair of neighboring via conductors 4V that is so formed as to overlap with each other in a top view. In this case, the conductive film 9 formed on at least part of the connection region SC is connected to the exposed portions in the connection region SC of at least the pair of neighboring via conductors 4V and the pattern conductor 4P sandwiched between the neighboring via conductors 4V. As a result, both the noise coming from the exterior and the noise generated from the electronic components 5 to 7 flow into the ground electrode 3A with certainty, thereby making it possible to obtain the electronic circuit module 100 having excellent electric characteristics.

<First Variation of Electronic Circuit Module>

Figure 3:
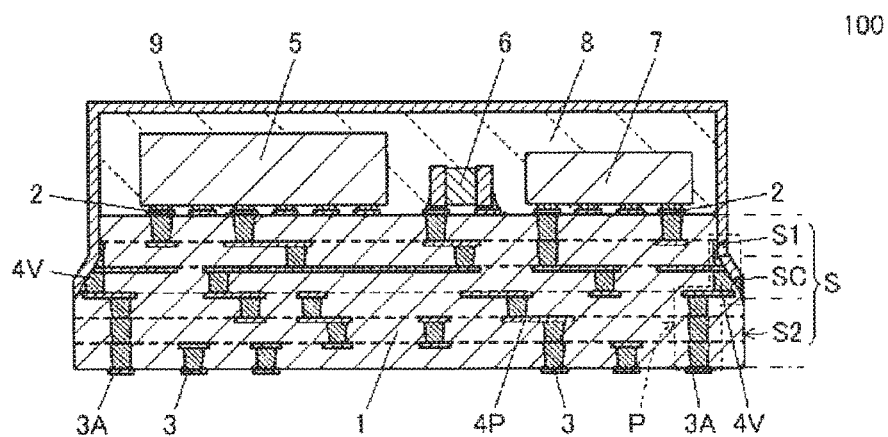
FIG. 3 is a cross-sectional view of a first variation on the electronic circuit module 100 according to the first embodiment of the present disclosure.

In FIG. 2, the shape from the first region S1 through the connection region SC on the side surface S of the circuit board 1 is illustrated in the form of what is called a bell-bottom shape. Meanwhile, as shown in FIG. 3, the connection region SC between the first region S1 and the second region S2 may be formed in a shape linearly spreading from the first region S1 toward the second region S2 when the electronic circuit module 100 being viewed from above. Also in this case, the contact area with the conductive film becomes sufficiently wide so that the connection between the conductive film and the ground electrode can be established with certainty.

In FIG. 3, the connection region SC spreads from the first region S1 toward the second region S2 with a predetermined slant. However, a lower end of the first region S1 and an upper end of the second region S2 may be on the same plane including a variation in manufacturing, and the connection region SC may become a level surface.

<Second Variation of Electronic Circuit Module>

Figure 4:
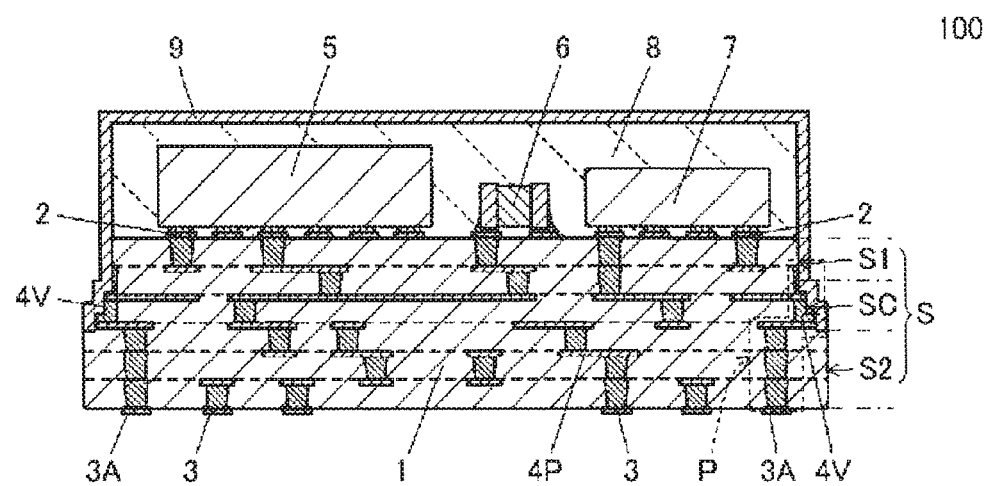
FIG. 4 is a cross-sectional view of a second variation on the electronic circuit module 100 according to the first embodiment of the present disclosure.

As shown in FIG. 4, the connection region SC on the side surface S of the circuit board 1 may be formed in a stepwise shape spreading from the first region S1 toward the second region S2 when the electronic circuit module 100 being viewed from above. In this case, the contact area with the conductive film becomes wider so that the connection between the conductive film and the ground electrode can be more surely established.

<Manufacturing Method for Electronic Circuit Module>

An example of a manufacturing method for the electronic circuit module 100 according to the first embodiment of the present disclosure will be described with reference to FIGS. 5A, 5B, 5C, 6A, 6B and 6C. FIGS. 5A, 5B, 5C, 6A, 6B and 6C include views schematically illustrating a preparation process, a mounting process, an embedding layer formation process, a groove formation process, a conductive film formation process, and an isolation process, respectively, that are carried out in the example of the manufacturing method for the electronic circuit module 100. Each of the views in FIGS. 5A, 5B, 5C, 6A, 6B and 6C corresponds to the cross-sectional view of the surface including the A-A line and seen in the arrow direction in FIG. 1B (see FIG. 2).

Although some of the constituent elements are not assigned reference signs in FIGS. 5A, 5B, 5C, 6A, 6B and 6C so as to avoid complexity, such elements are referenced by the reference signs of the corresponding elements in the electronic circuit module 100 shown in FIG. 2.

<Preparation Process>

Figure 5A:
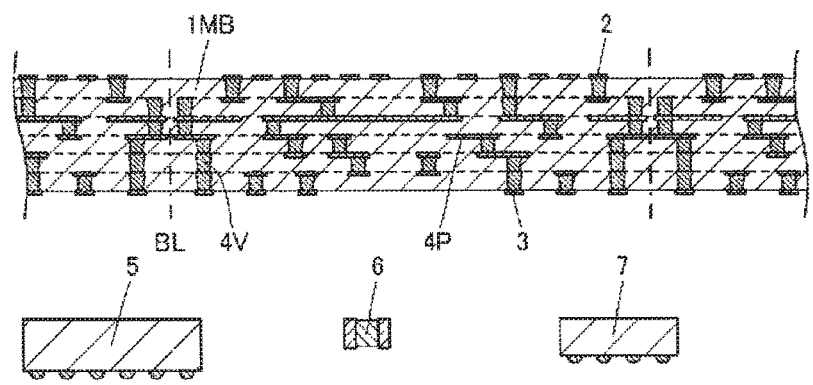
FIGS. 5A, 5B and 5C include views for explaining an example of a manufacturing method for the electronic circuit module 100 according to the first embodiment of the present disclosure described in FIG. 1A, FIG. 1B and FIG. 2, and the respective views schematically illustrate a preparation process, a mounting process, and an embedding layer formation process.

FIG. 5A is a view schematically illustrating the preparation process in the manufacturing method for the electronic circuit module 100. By the preparation process, a collective board 1MB which is the aggregation of the circuit boards 1 and the electronic components 5 to 7 are prepared. Detailed descriptions of the circuit board 1 and the electronic components 5 to 7 are omitted herein because they have already been given in the description of the structure of the electronic circuit module 100.

In FIG. 5A, an isolation position of the collective board 1MB for obtaining singulated electronic circuit modules 100 in the isolation process to be explained later is indicated by an isolation line BL. The isolation line BL is an imaginary line and therefore does not indicate that such a line is actually present inside the collective board 1MB.

Being in the state of the collective board 1MB, a predetermined via conductor among the via conductors 4V included in the conduction path P that extends to the ground electrode 3A is formed, taking the isolation line BL as a target position, at a position where part of the predetermined via conductor is exposed after the groove formation process to be explained later. In FIG. 5A, as an example, two pairs of rows of the via conductors 4V are formed adjacent to each other so as to be arranged at the above-mentioned position, and parts of the two pairs of rows of the via conductors 4V are exposed at the same time by the groove formation process.

<Mounting Process>

Figure 5B:
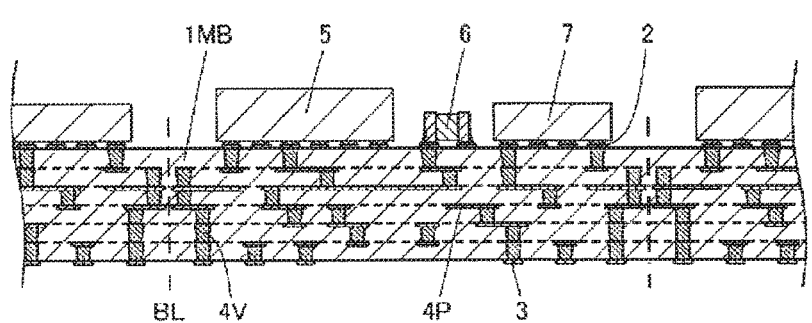

FIG. 5B is a view schematically illustrating the mounting process in the manufacturing method for the electronic circuit module 100. By the mounting process, the electronic components 5 to 7 are respectively connected onto the first electrodes 2 provided on the first principal surface M1 of the circuit board 1 in the state of the collective board 1MB so as to configure the electronic circuit.

In FIG. 5B, the electronic components 5 to 7 are connected onto the first electrodes 2 of the circuit board 1 with a bonding material such as solder or the like, for example. Soldering can be carried out by selecting one of the flow soldering and the reflow soldering in accordance with heat resistance or the like of the electronic components 5 to 7. The electronic components 5 to 7 may be connected onto the first electrodes 2 with a conductive adhesive.

<Embedding Layer Formation Process>

Figure 5C:
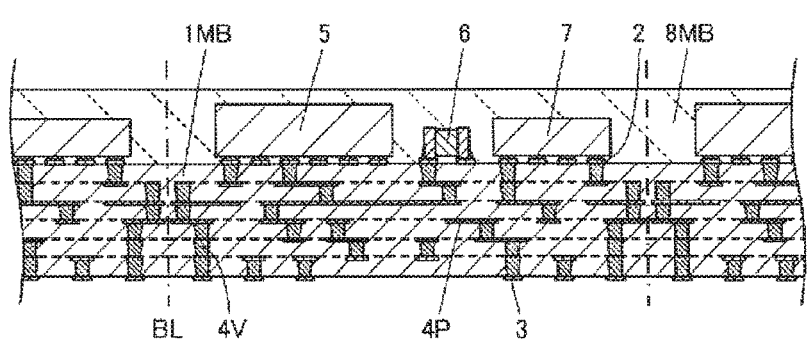

FIG. 5C is a view schematically illustrating the embedding layer formation process in the manufacturing method for the electronic circuit module 100. By the embedding layer formation process, the embedding layer 8 in the state of a collective embedding layer 8MB is provided on the first principal surface M1 of the circuit board 1 in the state of the collective board 1MB. Detailed description of the embedding layer 8 is omitted herein because it has already been given in the description of the structure of the electronic circuit module 100.

The formation of the collective embedding layer 8MB is carried out in the following manner: that is, a liquid resin is applied onto a first principal surface of the collective board 1MB on which the electronic components 5 to 7 are mounted using a dispenser, for example, so that the applied liquid resin has a predetermined thickness, and thereafter the liquid resin is heated and cured. The device for applying the liquid resin is not limited to the above dispenser, and existing applicators can be used instead. For example, various kinds of coaters such as a curtain coater, a spin coater, and so on may be used. Further, the formation of the collective embedding layer 8MB may be carried out as follows: that is, sheet-formed prepreg in a semi-cured state is placed on one principal surface of the collective board 1MB and pressed so as to embed the electronic components 5 to 7, and thereafter the prepreg is heated and cured.

<Groove Formation Process>

Figure 6A:
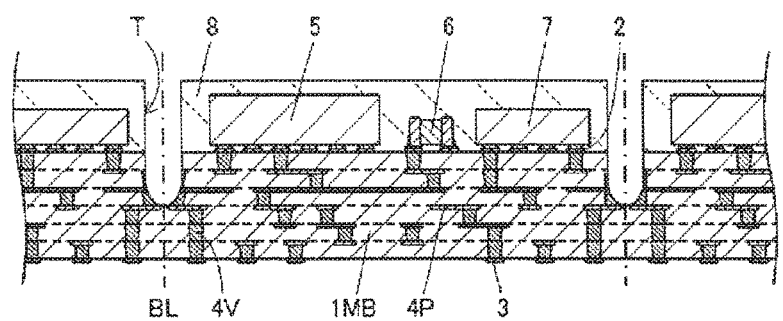
FIGS. 6A, 6B and 6C, which are continued from FIGS. 5A, 5B and 5C, include views for explaining the example of the manufacturing method for the electronic circuit module 100 according to the first embodiment of the present disclosure, and the respective views schematically illustrate a groove formation process, a conductive film formation process, and an isolation process.

FIG. 6A is a view schematically illustrating the groove formation process in the manufacturing method for the electronic circuit module 100. By the groove formation process, a groove T is formed penetrating from the upper surface of the collective embedding layer 8MB into collective board 1MB until the groove has a predetermined depth in the collective board 1MB; on the first principal surface of the collective board 1MB, the collective embedding layer 8MB is formed. Accordingly, the formation of the groove T isolates the collective embedding layer 8MB into individual embedding layers 8, in each of which the electronic components 5 to 7 are embedded.

Although FIG. 6A illustrates a case in which the groove T is formed in a U shape without having a flat portion, the groove T may be formed in a U shape having a flat portion. Further, corresponding to the aforementioned first variation, the groove T may be formed in a pentagonal shape in which the width of the groove T linearly changes from a predetermined depth position while taking the isolation line BL as a symmetry plane. Furthermore, corresponding to the aforementioned second variation, the groove T may be formed in a stepwise shape.

An inner surface of the groove T corresponds to the side surface 8S of the embedding layer 8 as well as the first region S1 and the connection region SC of the side surface S of the circuit board 1 in the electronic circuit module 100 after the singulation. As discussed above, a predetermined via conductor among the via conductors 4V included in the conduction path P that extends to the ground electrode 3A is formed, taking the isolation line BL as a target position, at a position where part of the predetermined via conductor is exposed when the groove T is formed. In other words, forming the groove T makes part of a row of the via conductors 4V inside the collective board 1MB be exposed in a shape similar to the bell-bottom shape of the connection region SC. In FIG. 6A, by forming the groove T, parts of two pairs of rows of the via conductors 4V are exposed at the same time.

The formation of the groove T is carried out in the following manner: that is, the collective board 1MB on the first principal surface of which the collective embedding layer 8MB is formed is half cut with a dicing saw, for example. In the example of the manufacturing method for the electronic circuit module 100 according to the first embodiment, such an outer circumference portion (blade end surface) of a dicing blade is used that has a U-shaped cross section by what is called dressing. The above-discussed groove T having a U-shaped cross section can be obtained by half-cutting operation using the dicing blade on which the above dressing has sufficiently been performed. It is to be noted that the groove T may be formed using a dicing blade having a U-shaped cross section in advance, or other known methods may be used for forming the groove T.

<Conductive Film Formation Process>

Figure 6B:
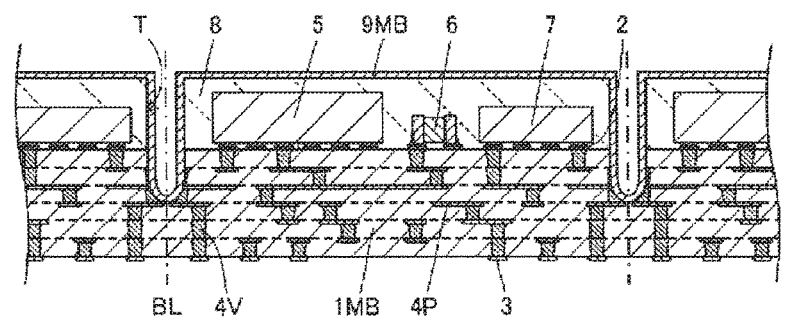

FIG. 6B is a view schematically illustrating the conductive film formation process in the manufacturing method for the electronic circuit module 100. By the conductive film formation process, the conductive film 9 in the state of a collective conductive film 9MB is formed on the upper surface 8U and the side surface 8S (outer surface 8O) of the embedding layer 8 as well as on the first region S1 and the connection region SC of the circuit board 1 in the state of the collective board 1MB. Detailed description of the conductive film 9 is omitted herein because it has already been given in the description of the structure of the electronic circuit module 100. It is sufficient for the conductive film 9 to be formed on a region including at least part of each of the outer surface 8O of the embedding layer 8, the first region S1, and the connection region SC.

The formation of the collective conductive film 9MB is carried out in the following manner: that is, a metallic thin film is attached to the outer surface 8O of the embedding layer 8 and the first region S1 and the connection region SC of the circuit board 1 by, for example, what is called a thin film forming method such as sputtering, deposition, or the like. Further, the formation of the collective conductive film 9MB may be carried out in the following manner: that is, a liquid conductive resin is spread out on the outer surface 8O of the embedding layer 8 and the first region S1 and the connection region SC of the circuit board 1 by a spin coat method, for example, and thereafter the liquid conductive resin is heated and cured.

Through the above process, the exposed portion in the connection region SC of the via conductor 4V included in the conduction path P that extends to the ground electrode 3A is connected to the conductive film 9 that is formed on at least part of the connection region SC.

<Isolation Process>

Figure 6C:
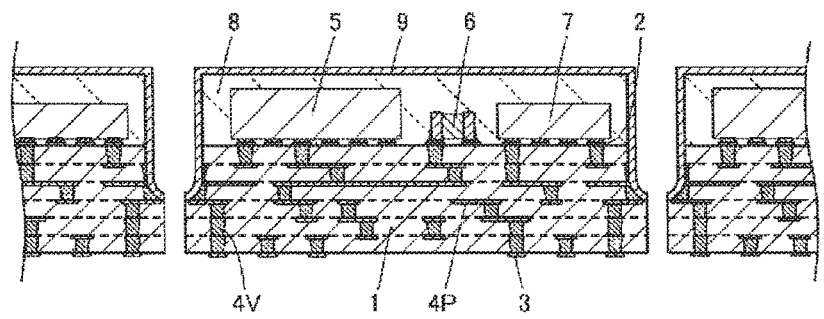

FIG. 6C is a view schematically illustrating the isolation process in the manufacturing method for the electronic circuit module 100. The isolation process isolates the collective board 1MB into individual circuit boards 1, thereby singulated electronic circuit modules 100 being obtained.

The isolation of the collective board 1MB in the isolation process is carried out by dividing the collective board along the isolation line BL or by cutting the collective board with a dicing blade whose thickness is thinner than that of the dicing blade used in the groove formation process (see FIG. 6A) while taking the isolation line BL as a target position. A dividing surface or a cutting surface of the collective board 1MB created by the isolation process becomes the second region S2 on the side surface S of the circuit board 1. Accordingly, the circumferential length of the second region S2 is longer than that of the first region S1 of the circuit board 1.

Second Embodiment of Electronic Circuit Module

An electronic circuit module 200 according to a second embodiment of the present disclosure will be described with reference to FIG. 7.

The electronic circuit module 200 differs from the electronic circuit module 100 according to the first embodiment in a point that a conduction path P extending to a ground electrode 3A does not include the pattern conductor 4P; to a portion near one end and a portion near the other end of the stated pattern conductor 4P, two pairs of rows of the via conductors 4V are connected in the first embodiment. Because other constituent elements are the same as those of the electronic circuit module 100, descriptions of the same constituent elements will be omitted.

Figure 7:
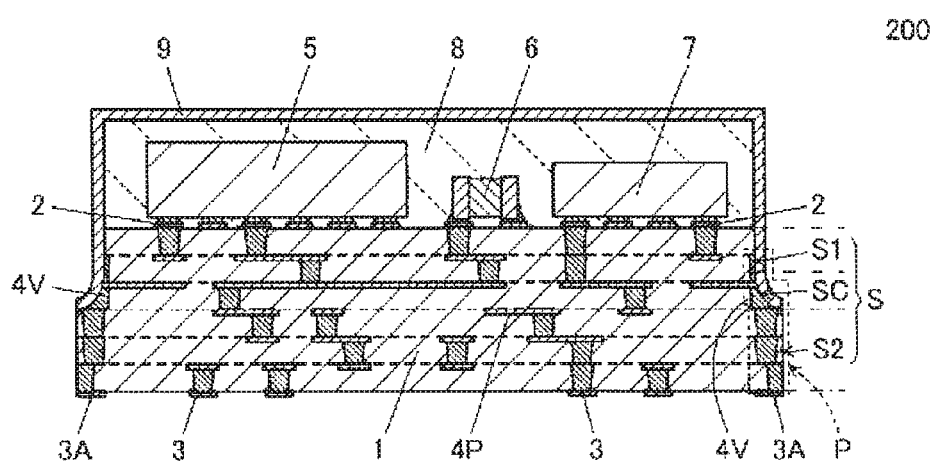
FIG. 7 is a cross-sectional view of an electronic circuit module 200 according to a second embodiment of the present disclosure.

FIG. 7 is a cross-sectional view of the electronic circuit module 200, and FIG. 7 corresponds to FIG. 2. In the electronic circuit module 200, the ground electrode 3A is positioned adjacent to the second region S2 on the side surface S of the circuit board 1. Because of this, the conduction path P extending to the ground electrode 3A does not include the pattern conductor 4P that causes the conduction path P to be bent, and is configured of a pair of rows of the via conductors 4V.

Further, in an example of FIG. 7, the via conductor 4V connected to the ground electrode 3A is exposed to the second region S2. In this case, when the electronic circuit module 200 is mounted on a circuit board of an electronic apparatus using solder, a solder fillet is also formed in the second region S2 so that the enhancement of bonding strength can be expected.

The above-mentioned pair of rows of the via conductors 4V is formed so that neighboring via conductors 4V overlap with each other when the electronic circuit module 200 being viewed from above. Further, the conductive film 9 formed on at least part of the connection region SC on the side surface S of the circuit board 1 is connected to the exposed portions in the connection region SC of at least a pair of the neighboring via conductors 4V. In other words, because the conduction path P in the electronic circuit module 200 is not largely bent, a distance from the conductive film 9 to the ground electrode 3A is shorter than that of the electronic circuit module 100. As a result, electric resistance of the conduction path P is suppressed to be low.

Halfway in the row of the via conductors 4V, like in the first embodiment, the pattern conductor 4P may be sandwiched between the neighboring via conductors 4V that are so formed as to overlap with each other in a top view.

Third Embodiment of Electronic Circuit Module

An electronic circuit module 300 according to a third embodiment of the present disclosure will be described with reference to FIGS. 8A and 8B.

In the electronic circuit module 300, like in the electronic circuit module 200 according to the second embodiment, the conduction path P extending to the ground electrode 3A is formed of a pair of rows of via conductors 4V. However, the electronic circuit module 300 is characterized by the arrangement of these via conductors 4V. Because other constituent elements are the same as those of the electronic circuit module 200, descriptions of the same constituent elements will be omitted.

Figure 8A:
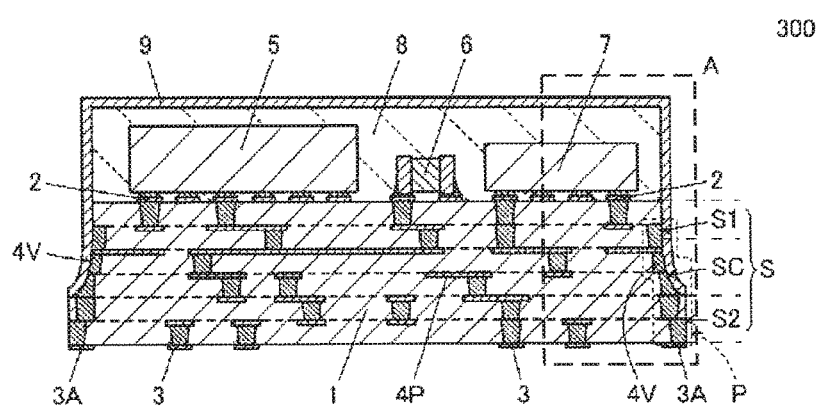
FIGS. 8A and 8B include a cross-sectional view and a main portion enlarged view of an electronic circuit module 300 according to a third embodiment of the present disclosure.
Figure 8B:
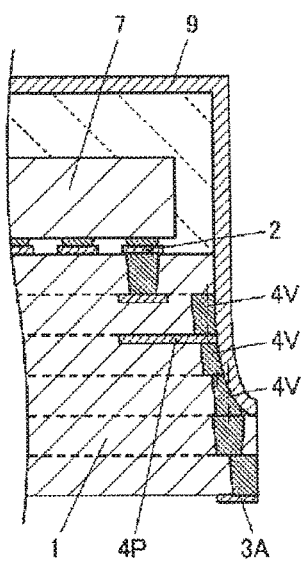

FIG. 8A is a cross-sectional view of the electronic circuit module 300, and FIG. 8A corresponds to FIG. 2. FIG. 8B is an enlarged view of a main portion "A" in FIG. 8A including the conduction path P that extends to the ground electrode 3A.

In the electronic circuit module 300, the plurality of via conductors 4V configuring the conduction path P are formed while the respective center axes thereof (indicated by dot-dash lines in FIG. 8B) being shifted from each other along the connection region SC in a top view. As such, an area of the exposed portions in the connection region SC of the via conductors 4V is larger than the area in the case where the center axes of the via conductors 4V are the same.

Halfway in the row of the via conductors 4V, like in the first and second embodiments, the pattern conductor 4P may be sandwiched between the neighboring via conductors 4V that are so formed as to overlap with each other in a top view.

Fourth Embodiment of Electronic Circuit Module

An electronic circuit module 400 according to a fourth embodiment of the present disclosure will be described with reference to FIG. 9.

<Structure of Electronic Circuit Module>

In the electronic circuit module 400, like in the electronic circuit module 300 according to the third embodiment, a plurality of via conductors 4V configuring the conduction path P are formed while the respective center axes thereof being shifted from each other along the connection region SC. However, the electronic circuit module 400 is characterized by the mode in which the via conductors 4V are exposed to the side surface S of the circuit board 1 as well as by the shape of the conductive film 9. Because other constituent elements are the same as those of the electronic circuit module 300, descriptions of the same constituent elements will be omitted.

Figure 9:
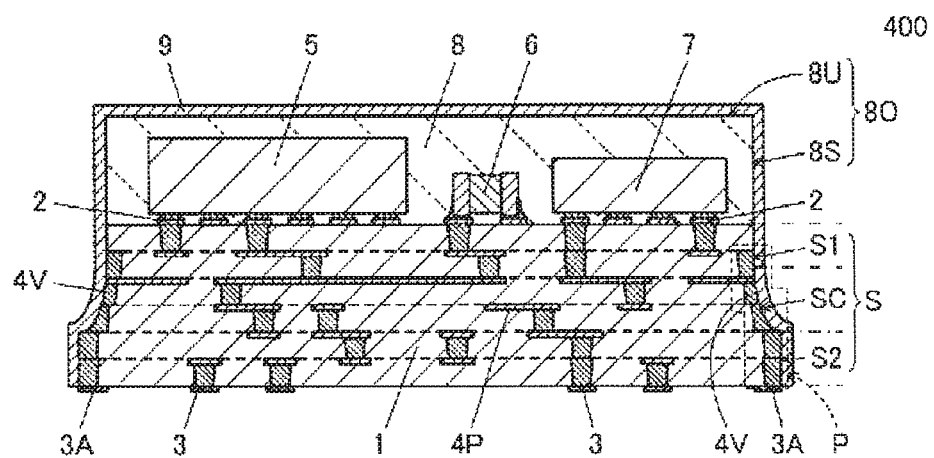
FIG. 9 is a cross-sectional view of an electronic circuit module 400 according to a fourth embodiment of the present disclosure.

FIG. 9 is a cross-sectional view of the electronic circuit module 400, and FIG. 9 corresponds to FIG. 2. In the electronic circuit module 400, some of the plurality of via conductors 4V configuring the conduction path P are exposed to at least part of each of the connection region SC and the second region S2. In an example of FIG. 9, although the via conductor 4V is also exposed to the first region S1, it may not be exposed to the first region S1.

The conductive film 9 is formed on a region including at least part of each of the outer surface 8O of the embedding layer 8, the first region S1, the connection region SC, and the second region S2 on the side surface S of the circuit board 1. Then, the conductive film 9 is connected to the exposed portion on the side surface S of the via conductor 4V included in the conduction path P that extends to the ground electrode 3A. In the case where, as discussed above, the via conductor 4V is not exposed to the first region S1, the conductive film 9 is connected to the exposed portion thereof in each of the connection region SC and the second region S2.

In the electronic circuit module 400, due to its characteristics as described above, the connection between the conductive film 9 and the ground electrode 3A is more surely established. In addition, since the conductive film 9 is so formed as to reach the second region S2, an area covered by the conductive film 9 is wider in the electronic circuit module 400 than that in each of the electronic circuit modules of the first through third embodiments.

Halfway in the row of the via conductors 4V, like in the first through third embodiments, the pattern conductor 4P may be sandwiched between the neighboring via conductors 4V that are so formed as to overlap with each other in a top view. Note that in the fourth embodiment, the electronic circuit module 400 is described as being configured by adding the above-mentioned characteristics to the electronic circuit module 300 according to the third embodiment. Meanwhile, the electronic circuit module 400 according to the fourth embodiment may be configured by adding the above-mentioned characteristics to the electronic circuit module 200 according to the second embodiment (see FIG. 7).

<Manufacturing Method for Electronic Circuit Module>

An example of a manufacturing method for the electronic circuit module 400 according to the fourth embodiment of the present disclosure will be described with reference to FIGS. 10A, 10B, 10C, 11A, 11B and 11C. FIGS. 10A, 10B, 10C, 11A, 11B and 11C include views schematically illustrating a preparation process, a mounting process, an embedding layer formation process, a groove formation process, an isolation process, and a conductive film formation process, respectively, that are carried out in the example of the manufacturing method for the electronic circuit module 400. Each of the views in FIGS. 10A, 10B, 10C, 11A, 11B and 11C corresponds to the cross-sectional view of the surface including the A-A line and seen in the arrow direction in FIG. 1B (see FIG. 2).

Although some of the constituent elements are not assigned reference signs in FIGS. 10A,10B, 10C, 11A, 11B and 11C so as to avoid complexity, such elements are referenced by the reference signs of the corresponding elements in the electronic circuit module 100 shown in FIG. 2 and the electronic circuit module 400 shown in FIG. 9.

<Preparation Process>

Figure 10A:
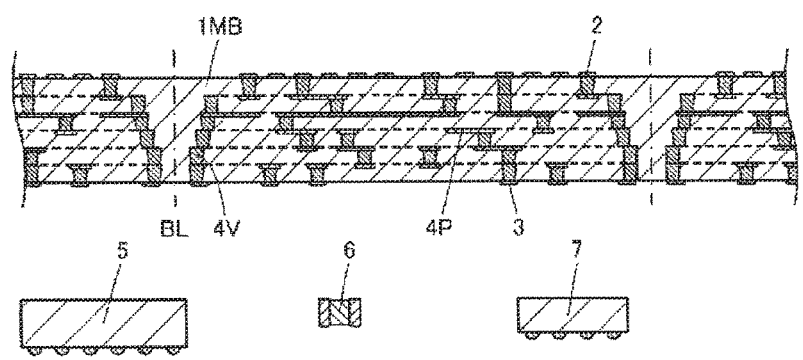
FIGS. 10A, 10B and 10C include views for explaining an example of a manufacturing method for the electronic circuit module 400 according to the fourth embodiment of the present disclosure described in FIG. 9, and the respective views schematically illustrate a preparation process, a mounting process, and an embedding layer formation process.

FIG. 10A is a view schematically illustrating the preparation process in the manufacturing method for the electronic circuit module 400. Because this preparation process is substantially the same as the preparation process in the manufacturing method for the electronic circuit module 100 according to the first embodiment, detailed description thereof will be omitted.

Being in the state of the collective board 1MB, the via conductor 4V included in the conduction path P that extends to the ground electrode 3A is formed, taking the isolation line BL as a target position, at a position where the stated via conductor 4V is exposed to the side surface S after the groove formation process and the isolation process to be explained later. In FIG. 10A, as an example, two pairs of rows of the via conductors 4V are formed adjacent to each other so as to be arranged at the above-mentioned position, and the two pairs of rows of the via conductors 4V are exposed at the same time by the groove formation process and the isolation process.

<Mounting Process>

Figure 10B:
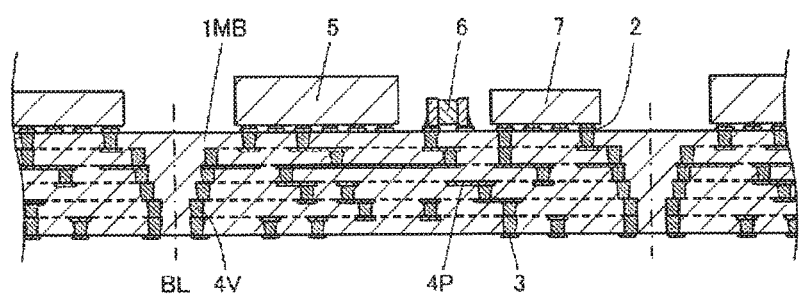

FIG. 10B is a view schematically illustrating the mounting process in the manufacturing method for the electronic circuit module 400. Because this mounting process is the same as the mounting process in the manufacturing method for the electronic circuit module 100 according to the first embodiment, detailed description thereof will be omitted.

<Embedding Layer Formation Process>

Figure 10C:
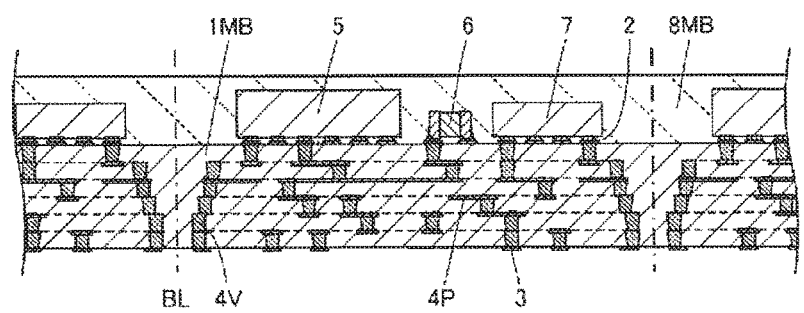

FIG. 10C is a view schematically illustrating the embedding layer formation process in the manufacturing method for the electronic circuit module 400. Because this embedding layer formation process is the same as the embedding layer formation process in the manufacturing method for the electronic circuit module 100 according to the first embodiment, detailed description thereof will be omitted.

<Groove Formation Process>

Figure 11A:
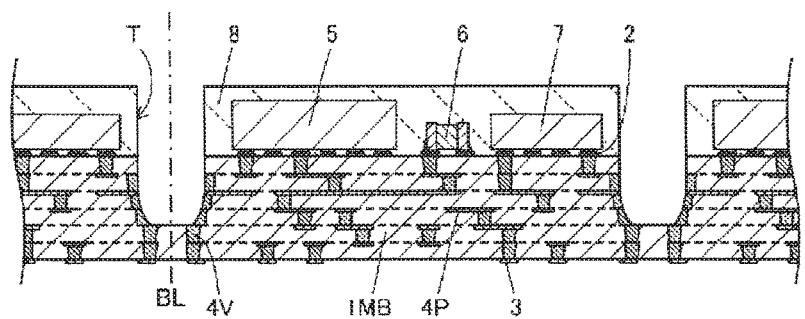
FIGS. 11A, 11B and 11C, which are continued from FIGS. 10A, 10B and 10C, include views for explaining the example of the manufacturing method for the electronic circuit module 400 according to the fourth embodiment of the present disclosure, and the respective views schematically illustrate a groove formation process, an isolation process, and a conductive film formation process.

FIG. 11A is a view schematically illustrating the groove formation process in the manufacturing method for the electronic circuit module 400. Because this groove formation process is substantially the same as the groove formation process in the manufacturing method for the electronic circuit module 100 according to the first embodiment, detailed description thereof will be omitted.

As discussed before, a predetermined via conductor among the via conductors 4V included in the conduction path P that extends to the ground electrode 3A is formed, taking the isolation line BL as a target position, at a position where part of the predetermined via conductor is exposed when the groove T is formed. In other words, forming the groove T makes part of a row of the via conductors 4V inside the collective board 1MB be exposed in a shape similar to the bell-bottom shape of the first region S1 and the connection region SC on the side surface S of the circuit board 1. In FIG. 11A, by forming the groove T, parts of two pairs of rows of the via conductors 4V are exposed at the same time.

<Isolation Process>

Figure 11B:
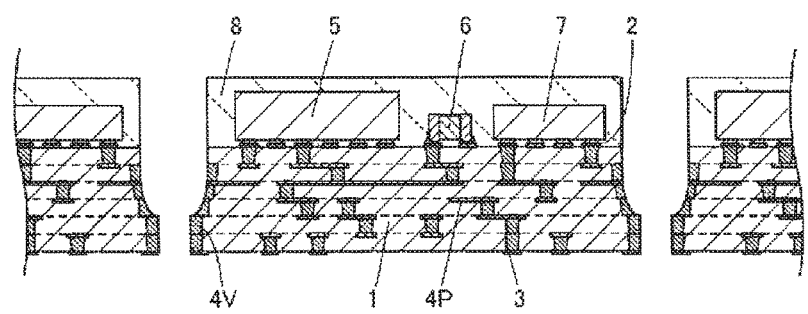

FIG. 11B is a view schematically illustrating the isolation process in the manufacturing method for the electronic circuit module 400. Because this isolation process is substantially the same as the isolation process in the manufacturing method for the electronic circuit module 100 according to the first embodiment, detailed description thereof will be omitted.

The manufacturing method for the electronic circuit module 400 differs from the manufacturing method for the electronic circuit module 100 in that the isolation process is carried out prior to carrying out the conductive film formation process. As such, it is preferable that the isolation process be carried out in a state in which a disordered state will not be brought about after the isolation of the collective board 1MB into individual circuit boards 1 by attaching the collective board 1MB to an adhesive sheet (not shown) or the like.

Through the above process, the plurality of via conductors 4V configuring the conduction path P are also exposed to at least part of the second region S2 in addition to the first region S1 and the connection region SC.

<Conductive Film Formation Process>

Figure 11C:
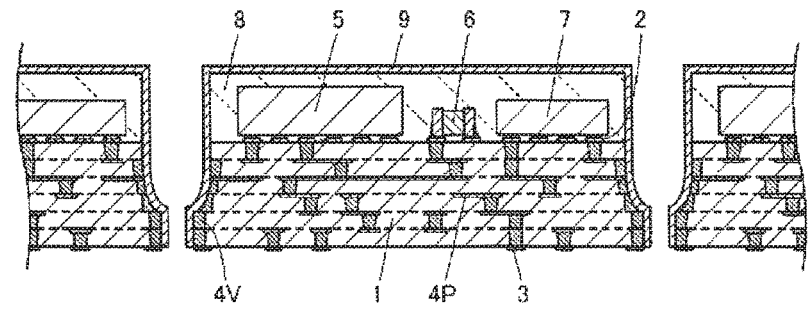
Figure 12A:
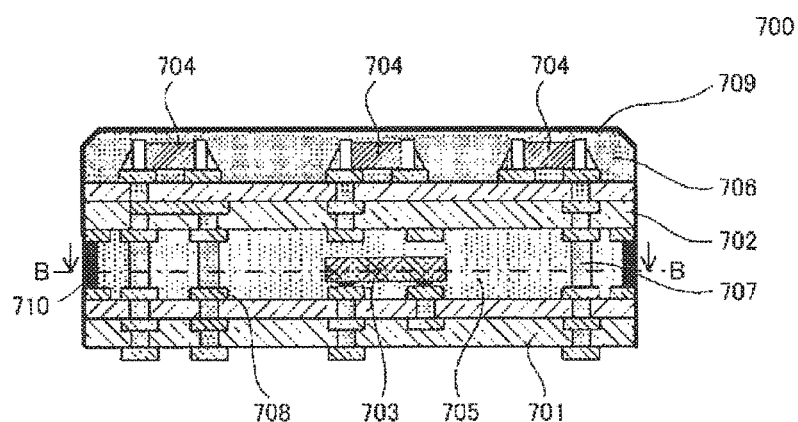
FIGS. 12A and 12B include cross-sectional views of an electronic circuit module 700 described in Background Art.
Figure 12B:
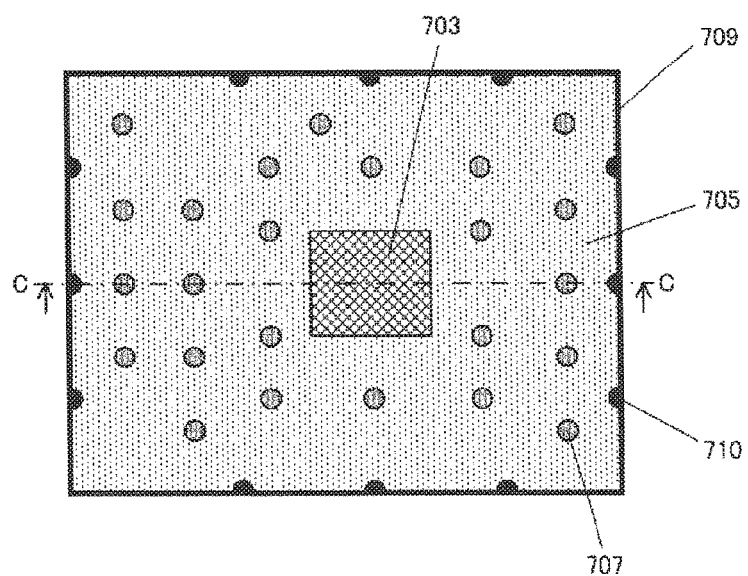

FIG. 11C is a view schematically illustrating the conductive film formation process in the manufacturing method for the electronic circuit module 400. Because this conductive film formation process is substantially the same as the conductive film formation process in the manufacturing method for the electronic circuit module 100 according to the first embodiment, detailed description thereof will be omitted.

By the conductive film formation process, the conductive film 9 is formed on the outer surface 8O of the embedding layer 8 as well as on a region including at least part of each of the first region S1, the connection region SC, and the second region S2 of the circuit board 1. Then, the exposed portion on the side surface S of the via conductor 4V included in the conduction path P that extends to the ground electrode 3A is connected to the conductive film 9 formed as discussed above.

The present disclosure is not limited to the above-described embodiments, and various kinds of applications and variations can be added without departing from the scope and spirit of the present disclosure. Further, it is to be noted that the embodiments described in the present specification are merely examples, and that the configurations thereof can be partly replaced or combined between different embodiments.

1 CIRCUIT BOARD
2 FIRST ELECTRODE
3 SECOND ELECTRODE
3A GROUND ELECTRODE
4 INNER CONDUCTOR
4P PATTERN CONDUCTOR
4V VIA CONDUCTOR
5-7 ELECTRONIC COMPONENT
8 EMBEDDING LAYER
8O OUTER SURFACE OF EMBEDDING LAYER
8S SIDE SURFACE OF EMBEDDING LAYER
8U UPPER SURFACE OF EMBEDDING LAYER
9 CONDUCTIVE FILM
100 ELECTRONIC CIRCUIT MODULE
M1 FIRST PRINCIPAL SURFACE
M2 SECOND PRINCIPAL SURFACE
P CONDUCTION PATH
S SIDE SURFACE
S1 FIRST REGION
S2 SECOND REGION
SC CONNECTION REGION

The invention claimed is:

1. An electronic circuit module comprising:
a circuit board having a first principal surface on which a first electrode is provided, a second principal surface on which a second electrode including a ground electrode is provided, and a side surface connecting the first principal surface and the second principal surface, and including, as an inner conductor, a pattern conductor and at least one via conductor;
an electronic component connected to the first electrode;
an embedding layer provided on the first principal surface of the circuit board and embedding the electronic component; and
a conductive film connected to a conduction path extending the ground electrode,
wherein the side surface of the circuit board includes a first region connected to the first principal surface, a second region connected to the second principal surface and having a longer circumferential length than the first region, and a connection region connected to the first region and the second region,
the conduction path extending to the ground electrode includes the via conductor,
the conductive film is provided on a region including at least a part of each of an outer surface of the embedding layer, the first region, and the connection region, and
the conductive film provided on at least the part of the connection region is connected to an exposed portion in the connection region of the via conductor included in the conduction path extending to the ground electrode.

2. The electronic circuit module according to claim 1, wherein the at least one via conductor includes a plurality of via conductors,
the plurality of via conductors are provided so neighboring ones of the via conductors overlap with each other when the electronic circuit module being viewed from above, and
the conductive film provided on at least the part of the connection region is connected to the exposed portions in the connection region of at least a pair of the neighboring ones of the via conductors.

3. The electronic circuit module according to claim 2, wherein the plurality of via conductors are provided while center axes of the via conductors being shifted from each other along the connection region when the electronic circuit module being viewed from above.

4. The electronic circuit module according to claim 2, wherein at least a pair of the neighboring ones of the via conductors is provided sandwiching the pattern conductor, and
the conductive film formed on at least the part of the connection region is connected to the exposed portions in the connection region of at least the pair of the neighboring ones of the via conductors and the pattern conductor sandwiched between the neighboring ones of the via conductors.

5. The electronic circuit module according to claim 2, wherein the conductive film is provided on a region including at least a part of each of the outer surface of the embedding layer, the first region, the connection region, and the second region, and
the conductive film provided on at least the part of each of the connection region and the second region is connected to the exposed portions of the plurality of via conductors in each of the connection region and the second region.

6. The electronic circuit module according to claim 3, wherein at least a pair of the neighboring ones of the via conductors is provided sandwiching the pattern conductor, and
the conductive film formed on at least the part of the connection region is connected to the exposed portions in the connection region of at least the pair of the neighboring ones of the via conductors and the pattern conductor sandwiched between the neighboring ones of the via conductors.

7. The electronic circuit module according to claim 3, wherein the conductive film is provided on a region including at least a part of each of the outer surface of the embedding layer, the first region, the connection region, and the second region, and
the conductive film provided on at least the part of each of the connection region and the second region is connected to the exposed portions of the plurality of via conductors in each of the connection region and the second region.

8. The electronic circuit module according to claim 4, wherein the conductive film is provided on a region including at least a part of each of the outer surface of the embedding layer, the first region, the connection region, and the second region, and the conductive film provided on at least the part of each of the connection region and the second region is connected to the exposed portions of the plurality of via conductors in each of the connection region and the second region.

* * * * *